(12) United States Patent
Yang et al.

(10) Patent No.: US 11,289,669 B2
(45) Date of Patent: Mar. 29, 2022

(54) LIGHT-EMITTING DEVICE, PIXEL UNIT, MANUFACTURING METHOD FOR PIXEL UNIT AND DISPLAY DEVICE

(71) Applicant: BOE TECHNOLOGY GROUP CO., LTD., Beijing (CN)

(72) Inventors: Shengji Yang, Beijing (CN); Xue Dong, Beijing (CN); Xiaochuan Chen, Beijing (CN); Hui Wang, Beijing (CN); Pengcheng Lu, Beijing (CN); Kuanta Huang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 65 days.

(21) Appl. No.: 16/643,354

(22) PCT Filed: Aug. 27, 2019

(86) PCT No.: PCT/CN2019/102832
§ 371 (c)(1),
(2) Date: Feb. 28, 2020

(87) PCT Pub. No.: WO2020/043093
PCT Pub. Date: Mar. 5, 2020

(65) Prior Publication Data
US 2021/0217980 A1 Jul. 15, 2021

(30) Foreign Application Priority Data
Aug. 30, 2018 (CN) .......................... 201811003378.1

(51) Int. Cl.
*H01L 51/50* (2006.01)
*H01L 27/32* (2006.01)
(Continued)

(52) U.S. Cl.
CPC .......... *H01L 51/504* (2013.01); *H01L 27/322* (2013.01); *H01L 51/5218* (2013.01); *H01L 51/5234* (2013.01); *H01L 51/56* (2013.01)

(58) Field of Classification Search
CPC . H01L 51/5218; H01L 51/5212; H01L 51/56; H01L 51/5206; H01L 51/504;
(Continued)

(56) References Cited

U.S. PATENT DOCUMENTS

| | | | |
|---|---|---|---|
| 2001/0043046 A1 | 11/2001 | Fukunaga | |
| 2015/0187858 A1* | 7/2015 | Wang | H01L 27/3279 257/40 |
| 2017/0243928 A1* | 8/2017 | Yang | H01L 51/5206 |

FOREIGN PATENT DOCUMENTS

| | | |
|---|---|---|
| CN | 1638581 A | 7/2005 |
| CN | 103928495 A | 7/2014 |
| CN | 109148725 A | 1/2019 |

OTHER PUBLICATIONS

Office Action dated Sep. 24, 2019 issued in corresponding Chinese Application No. 201811003378.1.
(Continued)

*Primary Examiner* — Kyoung Lee
*Assistant Examiner* — Christina A Sylvia
(74) *Attorney, Agent, or Firm* — Nath, Goldberg & Meyer; Joshua B. Goldberg (57) ABSTRACT

The present disclosure provides a light-emitting device, a pixel unit, a method for manufacturing the pixel unit, and a display device. The light-emitting device comprises a first electrode, an organic light-emitting layer and a second electrode which are sequentially disposed on a substrate; the first electrode comprises a reflecting layer, a transparent insulating layer and a transparent contact layer which are sequentially disposed on the substrate; and the second
(Continued)

electrode is a semi-transparent electrode, so that a cavity is formed between the second electrode and the reflecting layer.

14 Claims, 7 Drawing Sheets

(51) Int. Cl.
*H01L 51/52* (2006.01)
*H01L 51/56* (2006.01)

(58) Field of Classification Search
CPC ............. H01L 51/3523; H01L 27/3241; H01L 27/3211; H01L 27/322
See application file for complete search history.

(56) References Cited

OTHER PUBLICATIONS

Office Action dated Mar. 6, 2020 issued in corresponding Chinese Application No. 201811003378.1.
Office Action dated Aug. 7, 2020 issued in corresponding Chinese Application No. 201811003378.1.

* cited by examiner

LIGHT-EMITTING DEVICE, PIXEL UNIT, MANUFACTURING METHOD FOR PIXEL UNIT AND DISPLAY DEVICE

CROSS-REFERENCE TO RELATED APPLICATIONS

This is a National Phase Application filed under 35 U.S.C. 371 as a national stage of PCT/CN2019/102832, filed on Aug. 27, 2019, an application which claims priority to Chinese patent application No. 201811003378.1 filed on 30 Aug. 2018, which is incorporated herein by reference in its entirety.

TECHNICAL FIELD

The present disclosure relates to the field of display technology, and particularly relates to a light-emitting device, a pixel unit, a manufacturing method for the pixel unit and a display device.

BACKGROUND

An OLED (Organic light-emitting Diode) has the advantages of high luminance, rich colors, low driving voltage, high response speed, low power consumption, all-solid-state device, good anti-seismic performance, wide working temperature range (−40° C. to 85° C.) and the like; the OLED belongs to a self-luminous device, which has a wide viewing angle range and a thin thickness. The OLED is beneficial to reduce a size of a system, and is suitable for a near-eye display system.

SUMMARY

The present disclosure provides a light-emitting device, a pixel unit, a method for manufacturing the pixel unit, and a display device.

The light-emitting device includes a first electrode, an organic light-emitting layer, and a second electrode sequentially disposed on a substrate, the first electrode includes a reflecting layer, a transparent insulating layer and a transparent contact layer sequentially disposed on the substrate; and the second electrode is a semi-transparent electrode, such that a cavity is formed between the second electrode and the reflecting layer.

In an embodiment, the insulating layer is provided with a via hole therein, the via hole is filled with a conductive material to form a connecting pillar, and the reflecting layer and the contact layer are electrically coupled to each other through the connecting pillar.

In an embodiment, the organic light-emitting layer includes at least one hole layer of a hole injection layer and a hole transport layer, at least one electron layer of an electron injection layer and an electron transport layer, and at least one of a red light-emitting body layer, a green light-emitting body layer and a blue light-emitting body layer disposed between the at least one hole layer and the at least one electron layer.

In an embodiment, the first electrode is an anode, the second electrode is a cathode, and the organic light-emitting layer includes a hole injection layer, a hole transport layer, a red light-emitting body layer, a green light-emitting body layer, an electron transport layer, a charge generation layer, a hole injection layer, a hole transport layer, a blue light-emitting body layer, an electron transport layer, and an electron injection layer sequentially disposed on the first electrode.

The present disclosure further provides a pixel unit, including at least a first light-emitting device emitting light of a first color and a second light-emitting device emitting light of a second color, the first color being different from the second color, the first light-emitting device and the second light-emitting device each include a first electrode, an organic light-emitting layer and a second electrode sequentially disposed on a substrate, the first electrode includes a reflecting layer, a transparent insulating layer and a transparent contact layer sequentially arranged on the substrate; and the second electrode is a semi-transparent electrode; a first cavity is formed between the second electrode of the first light-emitting device and the reflecting layer of the first light-emitting device, and a second cavity is formed between the second electrode of the second light-emitting device and the reflecting layer of the second light-emitting device; and the first cavity of the first light-emitting device has a first cavity length corresponding to a wavelength of light of the first color, the second cavity of the second light-emitting device has a second cavity length corresponding to a wavelength of light of the second color, and the first cavity length is different from the second cavity length.

In an embodiment, the pixel unit further includes a third light-emitting device emitting light of a third color different from both the first color and the second color, the third light-emitting device includes a first electrode, an organic light-emitting layer and a second electrode sequentially disposed on a substrate, the first electrode includes a reflecting layer, a transparent insulating layer and a transparent contact layer sequentially disposed on the substrate; and the second electrode is a semi-transparent electrode; a third cavity is formed between the second electrode of the third light-emitting device and the reflecting layer of the third light-emitting device, and the third cavity of the third light-emitting device has a third cavity length corresponding to a wavelength of light of the third color, and the third cavity length is different from at least one of the first cavity length and the second cavity length.

In an embodiment, the light-emitting devices emitting light of different colors have the reflecting layers of a same thickness, have the contact layers of a same thickness, and have the insulating layers of thicknesses corresponding to the wavelength of respective emitted light.

In an embodiment, every two adjacent light-emitting devices emitting light of different colors are provided with a gap region therebetween, the insulating layers of the two adjacent light-emitting devices extended to the gap region and connected at the gap region to form a step structure; a support film is provided in the thicker insulating layer of the two insulating layers at the gap region, and the support film has a density greater than that of the other region of the insulating layer.

In an embodiment, the light-emitting devices emitting light of different colors have the same organic light-emitting layer and/or the same first electrode.

In an embodiment, the pixel unit further includes a pixel define layer disposed on the step structure.

In an embodiment, in each of the light-emitting devices, a color filter layer is further disposed on a side distal to the first electrode, the color filter layers disposed on the light-emitting devices emitting light of different colors are different in color, and the color filter layers enable the light-emitting devices to emit light of a single color, respectively.

In an embodiment, the first light-emitting device, the second light-emitting device and the third light-emitting devices emit red, green and blue light, respectively, and the thicknesses of the insulating layers of the first light-emitting device, the second light-emitting device and the third light-emitting devices increase sequentially.

The present disclosure further provides a method for manufacturing a pixel unit including at least a first light-emitting device emitting light of a first color and a second light-emitting device emitting light of a second color, the first color being different from the second color, the method including: forming a first reflecting layer of the first light-emitting device and a second reflecting layer of the second light-emitting device on a substrate; forming a transparent first insulating layer of the first light-emitting device and a transparent second insulating layer of the second light-emitting device on the first reflecting layer and the second reflecting layer, respectively; forming a transparent first contact layer of the first light-emitting device and a transparent second contact layer of the second light-emitting device on the first insulating layer and the second insulating layer, respectively; forming a first organic light-emitting layer of the first light-emitting device and a second organic light-emitting layer of the second light-emitting device on the first contact layer and the second contact layer, respectively; and forming a second electrode of the first light-emitting device and a second electrode of the second light-emitting device on the first organic light-emitting layer and the second organic light-emitting layer, respectively, such that the first cavity is formed between the second electrode and the first reflecting layer of the first light-emitting device, the second cavity is formed between the second electrode and the second reflecting layer of the second light-emitting device, and a first cavity length of the first cavity corresponding to a wavelength of light of the first color is different from a second cavity length of the second cavity corresponding to a wavelength of light of the second color.

In an embodiment, the method includes: forming the first reflecting layer of the first light-emitting device and the second reflecting layer of the second light-emitting device on the substrate by a single patterning process, such that the first reflecting layer and the second reflecting layer are spaced apart from each other to form a gap region between the first light-emitting device and the second light-emitting device; forming the transparent first contact layer of the first light-emitting device and the transparent second contact layer of the second light-emitting device on the first insulating layer and the second insulating layer respectively by a single patterning process, such that the first contact layer and the second contact layer are spaced apart each other and disposed on the first reflecting layer and the second reflecting layer respectively; forming the first organic light-emitting layer of the first light-emitting device and the second organic light-emitting layer of the second light-emitting device on the first contact layer and the second contact layer respectively by a single patterning process; and forming the second electrode of the first light-emitting device and the second electrode of the second light-emitting device on the first organic light-emitting layer and the second organic light-emitting layer respectively by a single patterning process.

In an embodiment, the forming the transparent first insulating layer of the first light-emitting device and the transparent second insulating layer of the second light-emitting device on the first reflecting layer and the second reflecting layer respectively includes: forming a first insulating film on the first reflecting layer, the second reflecting layer and the gap region such that the first insulating film is provided with a groove at the gap region; forming a support film in the groove by a plasma enhanced chemical vapor deposition process; and forming a second insulating film on the first insulating film of the second light-emitting device and the support film by a patterning process, wherein an orthogonal projection of the second insulating film on the substrate does not overlap an orthogonal projection of the first reflecting layer on the substrate.

In an embodiment, the method further includes: forming a first via hole in the first insulating film of the first light-emitting device and filling a conductive material in the first via hole to form a first connecting pillar; and forming a second via hole in the first insulating film and the second insulating film of the second light-emitting device and filling a conductive material in the second via hole to form a second connecting pillar.

In an embodiment, the forming the transparent first contact layer of the first light-emitting device and the transparent second contact layer of the second light-emitting device on the first insulating layer and the second insulating layer respectively by a single patterning process, such that the first contact layer and the second contact layer are spaced apart each other and disposed on the first reflecting layer and the second reflecting layer respectively includes: coating a photoresist on a part of the first insulating layer at the gap region and a part of the second insulating layer at the gap region; forming a contact film layer on a residual part of the first insulating layer, a residual part of the second insulating layer and the photoresist; and forming a first contact layer and a second contact layer by removing the photoresist.

In an embodiment, the method further includes forming a pattern including a pixel define layer on the gap region between the first light-emitting device and the second light-emitting device.

In an embodiment, the forming the first organic light-emitting layer of the first light-emitting device and the second organic light-emitting layer of the second light-emitting device on the first contact layer and the second contact layer respectively by a single patterning process includes: forming a hole injection layer, a hole transport layer, a red light-emitting body layer, a green light-emitting body layer, an electron transport layer, a charge generation layer, a hole injection layer, a hole transport layer, a blue light-emitting body layer, an electron transport layer, an electron injection layer on each of the first contact layer and the second contact layer by a deposition process; and the method for manufacturing the pixel unit further includes forming a first color filter layer corresponding to the first color and a second color filter layer corresponding to the second color on the second electrode of the first light-emitting device and the second electrode of the second light-emitting device, respectively.

The present disclosure further provides a display device, including a plurality of pixel units, each of which is the pixel unit mentioned above.

DETAILED DESCRIPTION

In order to make the technical solutions of the present disclosure better understood by a person skilled in the art, the light-emitting device, the pixel unit, the method for manufacturing the pixel unit, and the display device of the present disclosure are described in further detail below with reference to the accompanying drawings and the detailed description.

When the OLED device is used for a micro-display, all existing full-color technology adopts the combination of white light and color filter. Due to the limitation of an Fine Metal Mask (FMM), a high image resolution (i.e. Pixels Per Inch, PPI) can not be achieved. In addition, the full-color technology of combining white light and color filter limits the advantage of a higher color gamut of the OLED itself, about 80% of the color gamut of RGB that the OLED can realize. The technical idea of the present disclosure is to enhance a color gamut by white light having a strong cavity effect, improve an anode process and structure, achieve high luminance, and enhance luminous efficiency of RGB.

In the present disclosure, a photolithography process refers to a process including exposure, development, etching, etc., the process uses a photoresist, a mask, an exposure machine, etc. to form a pattern by etching; a patterning process includes a photolithography process and other processes for forming a predetermined pattern, such as printing and ink-jet.

In order to solve the problems that an OLED device is manufactured by an FMM at present, PPI resolution is limited, and high color gamut and luminance are difficult to obtain, an embodiment of the present disclosure provides a light-emitting device, and by improving an anode structure of the light-emitting device, not only high resolution, color gamut and luminance can be obtained, but also the manufacturing of the OLED device can be completed without using the FMM.

The light-emitting device includes a first electrode, a second electrode and an organic light-emitting layer arranged between the first electrode and the second electrode, wherein the first electrode is a semi-transparent electrode, and a reflecting structure is arranged in the second electrode. A cavity is formed between the semi-transparent first electrode and the reflective structure of the second electrode.

In the present disclosure, one of the first electrode and the second electrode is an anode, and the other is a cathode. In the following embodiment, an example in which the first electrode is an anode 3, and the second electrode is a cathode 6 is shown, as shown in FIG. 1.

Figure 1:
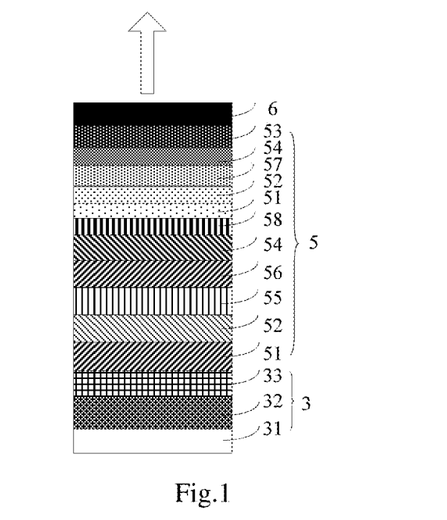
FIG. 1 is a schematic diagram of a structure of a light-emitting device according to an embodiment of the present disclosure.

As shown in FIG. 1, the light-emitting device includes an anode 3, a semi-transparent cathode 6, and an organic light-emitting layer 5 between the anode 3 and the cathode 6. The anode 3 includes a reflecting layer 31, a transparent insulating layer 32, and a transparent contact layer 33, the insulating layer 32 located between the reflecting layer 31 and the contact layer 33, the reflecting layer 31 is disposed farther away from the cathode 6 than the contact layer 33, a cavity is formed between the cathode 6 and the reflecting layer 31. The light-emitting device is an OLED device, an anode 3 includes a reflecting layer 31, an insulating layer 32 and a contact layer 33, so as to adjust the cavity length of the cavity of the OLED device, obtain a higher color gamut and luminance, and the OLED device can be manufactured without using an FMM.

A cavity refers to an optical length between two reflective surfaces. A reflective metal and a semi-transparent semi-reflective metal are respectively formed as an anode and a cathode at two ends of the OLED device to form the OLED device with a strong microcavity effect. Due to the strong reflection effect of the metal electrode, for example, the cathode 6 is made of Mg—Ag, the reflecting layer 31 of the anode is made of Ag or Al, and the cathode and the anode each form a reflective mirror surface, so that the light beam directly emitted by the light-emitting body and the light beam reflected by the metal surface interfere with each other, and the OLED device with the strong microcavity structure can narrow the electroluminescence spectrum, and further improve the color purity to facilitate a display application.

Figure 3:
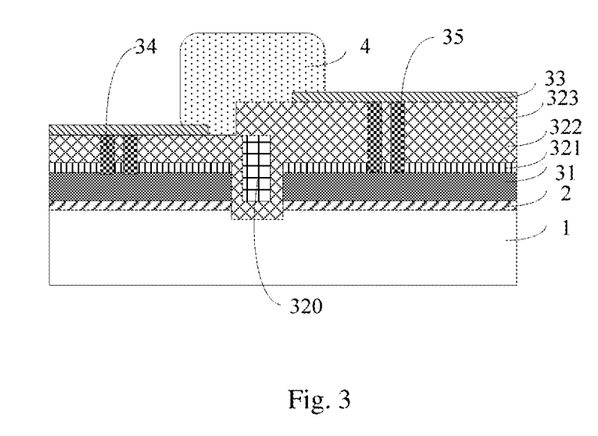
FIG. 3 is a schematic diagram of a structure of anodes of two adjacent light-emitting devices of a pixel unit according to an embodiment of the present disclosure.

As shown in FIG. 3, a via hole is formed in the insulating layer 32, and a conductive material is disposed in the via hole to form a connecting pillar, for example, the conductive material is tungsten. The reflecting layer 31 and the contact layer 33 are connected by tungsten. Tungsten has good conductivity and good process matching performance, and the reliability of receiving signals by the anode 3 can be ensured by connecting the reflecting layer 31 of the anode 3 and the contact layer 33 of the anode 3 by tungsten. The cavity length is changed by changing the distance between the reflecting layer 31 and the cathode 6.

Optionally, an organic layer 5 includes at least one hole layer of a hole injection layer 51 and a hole transport layer 52, at least one electron layer of an electron injection layer 53 and an electron transport layer 54, and at least one of a red light-emitting body layer (R) 55, a green light-emitting body layer (G) 56, and a blue light-emitting body layer (B) 57 disposed between the at least one hole layer and the at least one electron layer. That is, the RGB three-color light-emitting body layers are provided in one OLED device, thereby realizing a white light OLED device. Of course, the OLED device may further include a charge generation layer 58.

FIG. 1 shows a structure of a light-emitting device having an organic light-emitting layer of a laminated structure, and the light-emitting device sequentially includes, starting from a substrate 10:

an anode 3 including a reflecting layer 31, an insulating layer 32, and a contact layer 33 formed sequentially on the substrate 10;

an organic layer 5 including a hole injection layer 51, a hole transport layer 52, a red light-emitting body layer 55, a green light-emitting body layer 56, an electron transport layer 54, an charge generation layer 58, a hole injection layer 51, a hole transport layer 52, a blue light-emitting body layer 57, an electron transport layer 54, and an electron injection layer 53, which are formed sequentially on the contact layer 33; and a cathode 6.

Generally, the OLED device is formed by using an FMM to evaporate a different hole injection layer (HIL) 51 or hole transport layer (HTL) 52, which is not suitable for a high PPI white light OLED device, because a device higher than 800 PPI cannot be realized due to the limitation of the FMM.

And as a micro-display of a helmet, PPI of the OLED device needs to be over 2000. The OLED device in this embodiment adjusts the cavity length of the cavity by adjusting the thickness and structure of the anode 3, so that the preparation of the organic layer 5 is not influenced by the limitation of FMM accuracy, thereby achieving a higher resolution.

In addition, the cavity length of the white light OLED device is adjusted by adjusting the structure of the anode 3, and in combination with the color filter layer (see reference numeral 7 in FIG. 5) for filtering the light passing therethrough, only red light passes through a red color filter layer, only green light passes through a green color filter layer, and only blue light passes through a blue color filter layer, thereby in one aspect, improving color coordinates of a monochromatic point, and in another aspect, obtaining higher brightness.

In an embodiment of the present disclosure, a pixel unit including the above light-emitting device and a method of manufacturing the pixel unit are provided. The pixel unit is suitable for a large-sized display panel, can realize high resolution and simplify a manufacture process.

Figure 2:
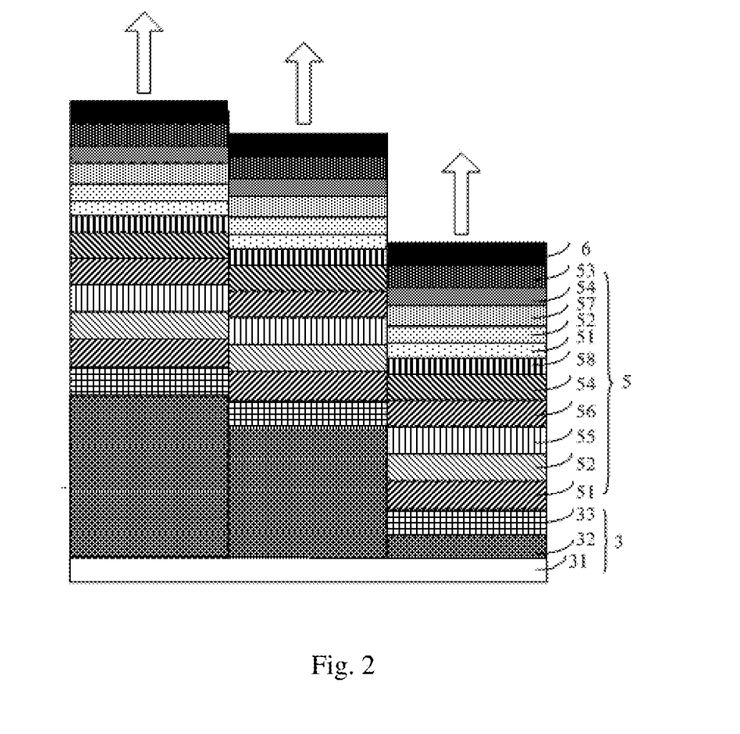
FIG. 2 is a schematic diagram of a structure of a pixel unit according to an embodiment of the present disclosure.

As shown in FIG. 2, the pixel unit includes at least two light-emitting devices of different colors, and the light-emitting devices are the light-emitting devices in the above embodiment. Different cavity lengths are provided between the cathodes 6 and the reflecting layers 31 of the anodes 3 of the light-emitting devices of different colors, and the cavity length is corresponding to the optical wavelength of the emergent light of the light-emitting device. The anodes 3 of the light-emitting devices of different colors in one pixel unit are configured to realize light wavelength adjustment for different colors. FIG. 2 shows a schematic diagram of three light-emitting devices in a laminated structure, which form a pixel unit of a full color display, and the anodes 3 of RGB pixels make the light-emitting devices of the respective pixels to have different cavity lengths.

As shown in FIG. 2, the reflecting layers 31 of the light-emitting devices of different colors have the same thickness, the contact layers 33 in the light-emitting devices of different colors have the same thickness, and the insulating layers 32 in the light-emitting devices of different colors have different thicknesses, which correspond to the light wavelengths of the emergent light of the light-emitting devices, respectively. By adjusting the thickness of the insulating layer 32 between the reflecting layer 31 and the contact layer 33 of the anode 3, the adjustment of the cavity length of the light-emitting device is realized. The partial structure of the anode 3 in a pixel unit in FIG. 3 includes two adjacent light-emitting devices emitting light of different colors.

In FIG. 3, a gap region is also provided between two adjacent light-emitting devices in the pixel unit. The insulation layers 32 of the two adjacent light-emitting devices both extend to the gap region and meet at the gap region. Since the thicknesses of the insulating layers 32 of the two adjacent light-emitting devices are different, the two insulating layers having different thicknesses form a step structure in the gap region. As shown in FIG. 3, a support film 320 is further disposed in the insulating layer of the light-emitting device having a thicker insulating layer, the support film 320 is located in the gap region and close to the step structure, the support film 320 is dense, and the density of the support film 320 is greater than that of the other regions of the insulating layer 32. That is, the insulating layers 32 of the adjacent light-emitting devices may be regarded as being continuously disposed but the thickness of the insulating layer of one light-emitting device is thicker at the gap region between two adjacent light-emitting devices, so that the thickness of the anode 3 of a specific light-emitting device in a pixel unit is adjusted by the insulating layers of different thicknesses to adjust the cavity length.

For the light-emitting device of the present disclosure, the cavity phase difference and the cavity length thereof satisfy the formula:

$$\delta = 2nd \cos\theta = 2j(\lambda/2)$$

Wherein: $\delta$ is the cavity phase difference, d is the length of the cavity length, j is an integer, $\lambda$ is the wavelength of the emergent light, n is the average refractive index of the medium in the cavity, and $\theta$ is the reflection angle. The wavelengths of red, green and blue light are, for example, 700 nm, 546.1 nm and 435.8 nm, respectively. By the formula of the cavity length, the cavity lengths of the light-emitting devices with different colors can be obtained. For example, as shown in FIG. 2, a red light-emitting device, a green light-emitting device, and a blue light-emitting device are sequentially provided from left to right. Since the wavelengths of red, green and blue light finally emitted from the respective light-emitting devices are sequentially decreased, it is required that the distance of the red light-emitting body layer 55 from the reflecting layer 31 in the red light-emitting device is maximized, the distance of the blue light-emitting body layer 57 from the reflecting layer 31 in the blue light-emitting device is minimized, and the distance of the green light-emitting body layer 56 from the reflecting layer 31 in the green light-emitting device is in the middle.

In order to obtain enhanced interference and optimize the light-emitting effect of the light-emitting device, changes of the phase of the back-and-forth optical path between the light-emitting body layer of each color and the reflecting layer of the anode are integral multiple of 2n.

Figure 4:
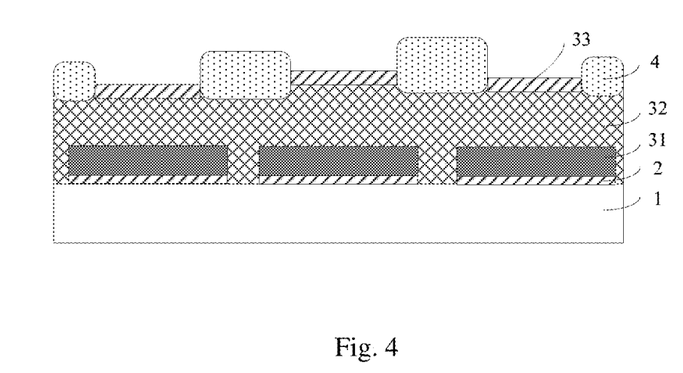
FIG. 4 is a schematic diagram of a structure of anodes of three adjacent light-emitting devices of a pixel unit according to one embodiment of the present disclosure.

As shown in FIG. 4, the insulating layer 32 has different thicknesses in one pixel unit according to the different colors of the emergent lights of respective light-emitting devices. The pixel unit includes three color light-emitting devices having different thicknesses of the insulating layer 32 of the anode, for example, a blue light-emitting device, a red light-emitting device, and a green light-emitting device sequentially.

Alternatively, the insulating layer 32 may be made of any one of silicon nitride SiNx, silicon oxide SiOx, or silicon oxynitride SiNO, and may be formed as a stack of a plurality of different materials. Depending on the different light-emitting wavelength of the light-emitting device, the thickness of the insulating layer 32 may be, for example, 300 Å-3000 Å.

Alternatively, all light-emitting devices in a pixel unit have the same organic layer 5 and/or cathode 6. In this way, the organic layer 5 for all light-emitting devices can be prepared using the same process (e.g., deposition process); the cathode 6 for all light-emitting devices may be prepared using the same process (e.g., patterning process).

In the above embodiments, the light wavelengths of different colors are matched by providing the light-emitting devices emitting different colors with the insulating layers of different thicknesses, while the other structures of the respective light-emitting devices are set to be the same, this configuration is made in order to minimize the difference between the respective light-emitting devices, and the respective light-emitting devices are distinguished only by changing the thickness of the insulating layer, which has the smallest influence on the light emission of the light-emitting devices. However, the present disclosure is not limited thereto, and for example, the light-emitting devices can also be distinguished from each other by distinguishing the thickness of the contact layer. However, since the contact layer has an influence on signal transmission of the light-emitting device, therefore, distinguishing light-emitting devices by setting contact layers with different thicknesses may bring about differences in other performances of the light-emitting devices, thereby making light emission control complicated.

Figure 5:
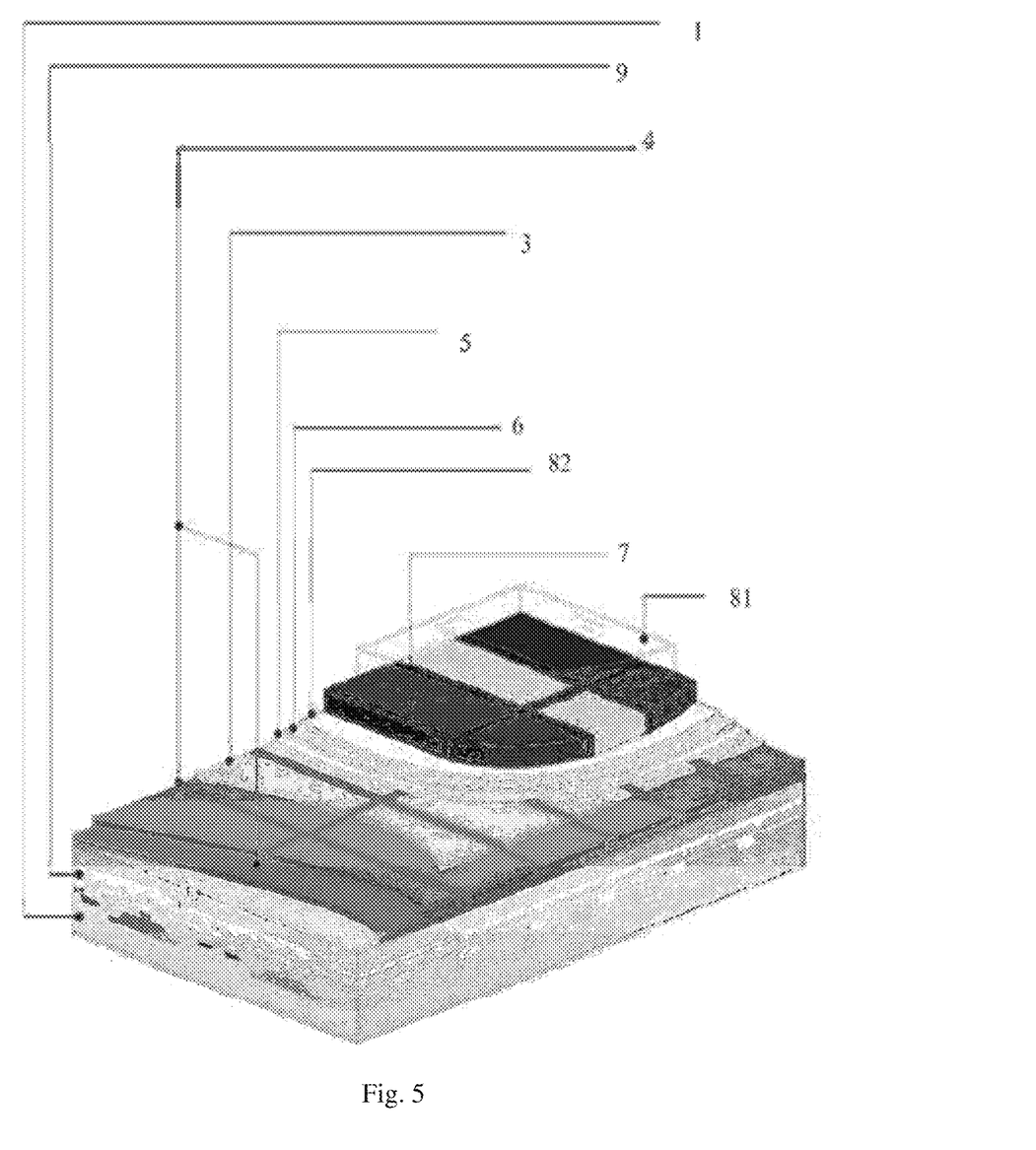
FIG. 5 is a schematic perspective diagram of the pixel unit shown in FIG. 2.

As shown in FIG. 5, on the basis of the white light OLED device shown in FIG. 1, a color filter layer 7 is further disposed on one side of each light-emitting device distal to the anode 3, the color filter layers 7 disposed on different light-emitting devices have different colors, and the color filter layer 7 enables the corresponding light-emitting device to emit light of a single color. Emergent light of the light-emitting devices with different colors can be filtered through the color filter layers 7. The pixel unit is packaged by a polymer and ceramic sealing package layer 82 and a glass sealing cover 81 from inside to outside, so that the sealing performance and the mechanical performance of the pixel unit are guaranteed.

Correspondingly, the manufacturing method of the pixel unit forms light-emitting devices of at least two different colors, and the light-emitting device is the light-emitting device disclosed by the present disclosure.

The manufacturing method of the pixel unit of the present disclosure enables: different cavity lengths are formed between the cathodes 6 and the reflecting layers 31 of the anodes 3 in the light-emitting devices of different colors of the pixel unit, and the cavity lengths correspond to emergent light wavelength of the light-emitting devices, respectively. The manufacturing method enables the pixel unit based on the white light OLED to enhance the color gamut and increase the brightness by configuring the anodes 3 of the light-emitting devices of different colors in the same pixel unit.

Figure 6:
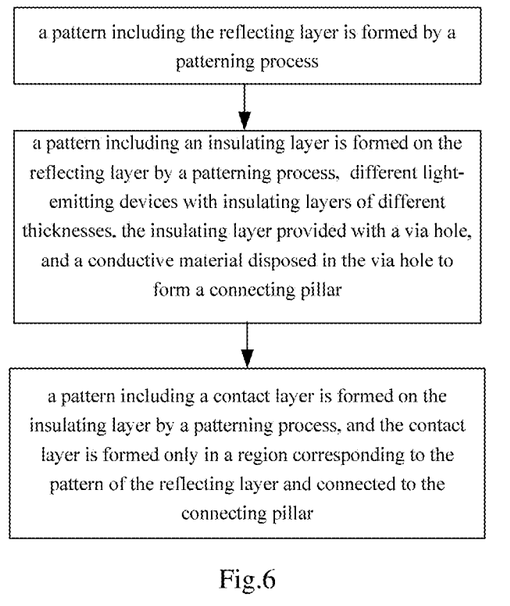
FIG. 6 is a flow diagram of a method for manufacturing anodes of adjacent light-emitting devices of a pixel unit according to an embodiment of the present disclosure.

As shown in FIG. 6, the method for manufacturing the anodes of the pixel unit specifically includes the steps of:

forming a pattern including the reflecting layer 31 by using a patterning process;

forming a pattern including an insulating layer 32 on the reflecting layer 31 by using a patterning process, such that the insulating layer 32 has different thicknesses at regions corresponding to different light-emitting devices, and the insulating layer 32 has respective via holes in the regions corresponding to the different light-emitting devices, the via holes having a conductive material such as tungsten disposed therein to form connecting pillars;

forming a pattern including a contact layer 33 on the insulating layer 32 by using a patterning process, such that the contact layer 33 is only formed at a region corresponding to the pattern of the reflecting layer 31 and connected to tungsten.

In the pixel unit, the reflecting layer 31 and the contact layer 33 are connected to each other through tungsten, which ensures reliable signals received by the anode 3, and the cavity length of the light-emitting device is matched by disposing the reflecting layer 31 and the cathode 6 opposite to each other.

In this embodiment, the overall thickness of the anodes 3 is adjusted by the insulating layer 32 to achieve the different cavity lengths of the light-emitting devices emitting light of different colors.

FIGS. 7A to 7M show only two adjacent light-emitting devices emitting light of different colors in one pixel unit, and at this time, the step of forming the insulating layer 32 includes, for example:

forming a first insulating material layer at regions corresponding to all the light-emitting devices and at a gap region between the adjacent light-emitting devices of the pixel unit;

forming a first via hole in the first insulating material layer at the region corresponding to one of the light-emitting devices;

forming a connecting pillar by disposing a conductive material in the via hole, such as tungsten;

forming a second insulating material layer at a region corresponding to the other light-emitting device without the via hole and at the gap region, forming a second via hole in the first insulating material layer and the second insulating material layer formed sequentially at a region of the other light-emitting device, and forming a connecting pillar by disposing a conductive material in the second via hole.

In the case where one pixel unit includes three light-emitting devices emitting light of different colors, the step of forming the insulating layer further includes forming a third insulating material layer at a region corresponding to a third light-emitting device and a gap region between the third light-emitting device and its adjacent light-emitting device; and forming a through hole in the first insulating material layer, the second insulating material layer and the third insulating material layer at the region corresponding to the third light-emitting device, and arranging a conductive material in the through hole to form a connecting pillar.

The above method shows only one example. After the insulating layers of different thicknesses of the three light-emitting devices emitting light of different colors are formed, via holes are formed in the respective insulating layers and connecting pillars are formed by disposing a conductive material in the respective via holes.

Next, a pattern including the contact layer 33 may be formed on the insulating layer 32.

In order to realize the correspondence between the cavity length and the wavelength of emergent light of the light-emitting device, the cavity phase difference and the cavity length of the light-emitting device can satisfy the following formula:

$$\delta = 2nd \cos \theta = 2j(\lambda/2)$$

Wherein: $\delta$ is the cavity phase difference, d is the length of the cavity length, j is an integer, $\lambda$ is the wavelength of the emergent light, n is the average refractive index of the medium in the cavity, and $\theta$ is the reflection angle. The wavelengths of the red light R, the green light G and the red light B are 700 nm, 546.1 nm and 435.8 nm respectively, and the cavity lengths of the light-emitting devices with different colors can be distinguished through the formula of the cavity lengths.

After the first insulating material layer is formed and before the via hole is formed, the manufacturing method further includes the following steps:

forming a reinforced via hole in the first insulating material layer at the gap region between adjacent light-emitting devices; and forming a dense support film 320 in the reinforcing via hole, such that a density the dense support film 320 is greater than that of the insulating material layer.

In this way, by embedding an insulating material with higher density between the adjacent light-emitting devices, the stability of the step structure between the two adjacent light-emitting devices can be maintained.

The manufacturing method further includes the following steps:

on the contact layer 33:

forming a pattern including the pixel define layer 4 at a region between adjacent light-emitting devices using a patterning process;

forming an organic light-emitting layer 5 on the contact layer 33 using a deposition process, the organic light-emitting layer 5 including at least one hole layer of a hole injection layer 51 and a hole transport layer 52, at least one electron layer of an electron injection layer 53 and an electron transport layer 54, and a red light emitting body layer 55, a green light emitting body layer 56, and a blue light emitting body layer 57 disposed between the at least one hole layer and the at least one electron layer;

forming a pattern including a cathode 6 on the organic layer 5.

All light-emitting devices in a pixel unit may have the same organic light-emitting layer 5 and/or cathode 6. In this way, the organic layer 5 can be manufactured using the same process (e.g., deposition process) for all light-emitting devices; the cathode 6 may be manufactured using the same process (e.g., using a patterning process) for all light-emitting devices.

The light-emitting devices emitting different colors constitute a pixel unit, and the pixel unit and its driving circuit are both integrated on the substrate 1. In the perspective cross-sectional view of the pixel unit shown in FIG. 5, the pixel unit includes a driving circuit 9 on the substrate 1, which includes a pixel driving circuit, a gate driver on array (GOA for short), and the like; and light-emitting devices emitting different colors, each light-emitting device including an anode 3, an organic light-emitting layer 5, a cathode 6; and a color film filter layer 7.

In the embodiments of the present disclosure, by providing the anode 3, a microcavity effect gain different from the prior art is achieved.

All steps for manufacturing an OLED device on a substrate 1 will be described in detail below with reference to FIGS. 7A-7M, taking manufacture of a device including two adjacent light-emitting devices as an example.

Figure 7A:
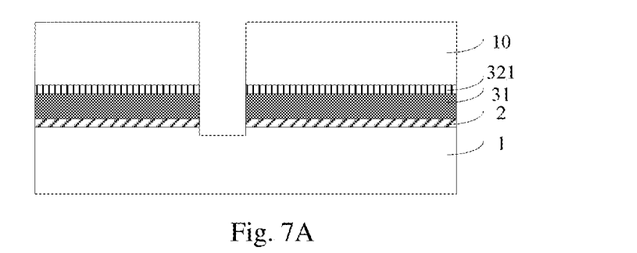
FIGS. 7A-7M are schematic process flow diagrams of a method for manufacturing the pixel unit in FIG. 5.

Step 1, a pattern including the reflecting layer 31 and a part of the insulating layer (first insulating sub-layer 321) is formed.

In this step, as shown in FIG. 7A, a metal reflecting film layer and an insulating material layer are formed on the substrate 1 on which the buffer material layer has been formed, and a via hole extending into a part of the substrate 1 is formed between adjacent pixel structures by a patterning process, and a pattern including the buffer layer 2, the metal reflecting layer 31, and the first insulating sub-layer 321 is formed. The patterning process includes the steps of coating the photoresist 10, exposure, development, and etching. The reflecting layer 31 has a thickness of, for example, 1000 Å, and the reflecting layer 31 is formed using, for example, Al; the first insulating sub-layer 321 has a thickness of 300 Å using, for example, $SiO_2$, and the via hole has a diameter approximately 0.2 μm.

Figure 7B:
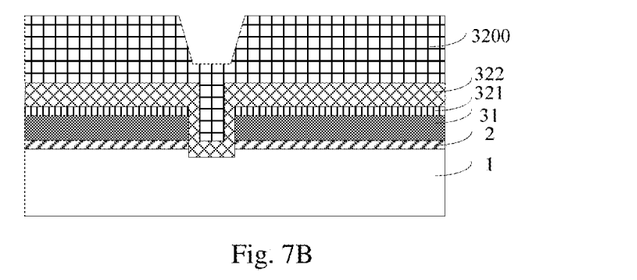

Step 2, a pattern including the second insulating sub-layer 322 is formed.

Figure 7C:
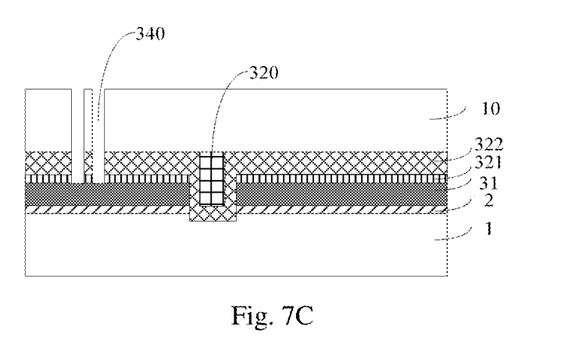

In this step, as shown in FIG. 7B, a remaining photoresist 10 is stripped, an insulating material layer is formed by Plasma Enhanced Chemical Vapor Deposition (PEVCD), photoresist is coated, and the photoresist is exposed, developed and dry etched to form the second insulating sub-layer 322 including a groove (which may be referred to as a reinforcement via hole); then, a dense material film 3200 is formed through a High Density Plasma (HDP) curing process, so as to form the dense support film 320 in FIG. 7C. The second insulating sub-layer 322 may be of, for example, SiO having a thickness t1 of 500 Å (50 nm) in a direction perpendicular to the substrate 1, while a thickness t2 of the second insulating sub-layer 322 between the support film 320 and the reflecting layer 31 in a direction parallel to the substrate 1 is approximately 0.1 μm (100 nm).

This step may further include performing a Chemical Mechanical Polishing (CMP) process on the support film 320 to obtain better planarity.

Step 3, a pattern including a first via hole (VIA) is formed.

This step includes, as shown in FIG. 7C, coating a photoresist 10 on the second insulating sub-layer 322 and the support film 320, exposing, developing, and etching the photoresist, thereby forming a first via hole 340 in the first insulating sub-layer 321 and the second insulating sub-layer 322 of the first light-emitting device, for example, the first via hole 340 may correspond to a center position of the first light-emitting device.

Figure 7D:
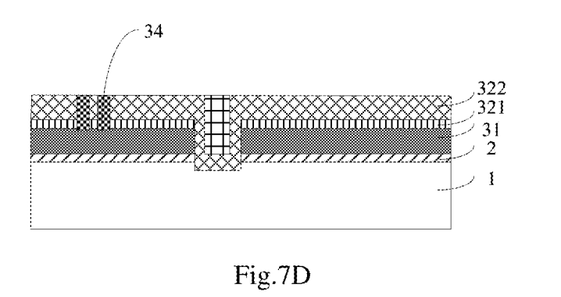

Step 4, a conductive material is filled in the first via hole.

This step includes, as shown in FIG. 7D, stripping the remaining photoresist 10, Chemical Vapor Deposition (CVD) of a conductive material such as tungsten (W), and Chemical Mechanical Polishing (CMP) to form the first connecting pillar 34.

Figure 7E:
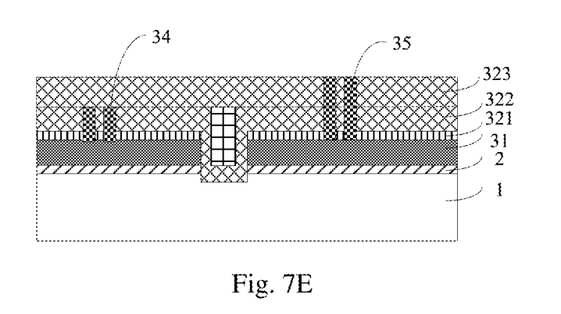

Step 5, a pattern including a third insulating sub-layer and a second via hole (VIA) is formed.

In this step, as shown in FIG. 7E, an insulating material layer is first formed on the second insulating sub-layer 322, then the photoresist 10 is coated on the insulating material layer, and the photoresist is exposed, developed, and etched to form a pattern of the third insulating sub-layer 323. A second via hole is then formed in the first insulating sub-layer 321, the second insulating sub-layer 322, and the third insulating sub-layer 323 of the second light-emitting device, and a second connecting pillar 35 is formed at the second via hole. The third insulating sub-layer 323 has a thickness of 1000 Å, and is made of, for example, SiO. The first insulating sub-layer 321, the second insulating sub-layer 322, and the third insulating sub-layer 323 collectively form the insulating layer 32 of the second light-emitting device.

Figure 7F:
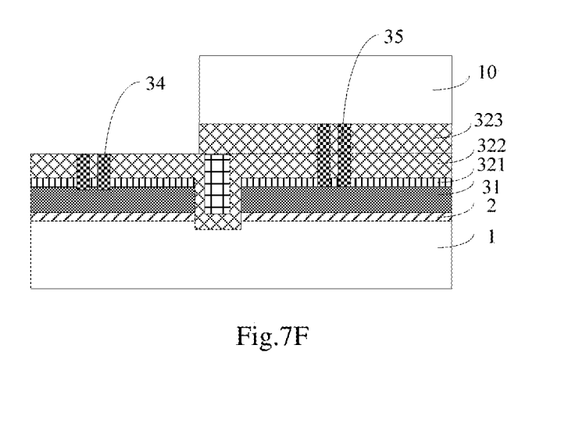

Step 6, the third insulating sub-layer 323 is patterned to form a first insulating layer of the first light-emitting device including the first insulating sub-layer 321 and the second insulating sub-layer 322 and a second insulating layer of the second light-emitting device including the first insulating sub-layer 321, the second insulating sub-layer 322, and the third insulating sub-layer 323, respectively.

In this step, as shown in FIG. 7F, a photoresist 10 is coated on the third insulating sub-layer 323, and the photoresist is exposed, developed, and etched to a depth reaching the top of the first connecting pillar 34, that is, removing the photoresist 10 in the region where the first light-emitting device is located, and the photoresist 10 in other regions is remained; further, a portion of the third insulating sub-layer 323 corresponding to an upper portion of the first light-emitting device is removed. The third insulating sub-layer 323 extends to the gap region between the two light-emitting devices and covers the support film 320, thereby forming a step structure at the gap region, and the step structure is formed of the second insulating sub-layer 322 of the first light-emitting device and the third insulating sub-layer 323 of the second light-emitting device.

Figure 7G:
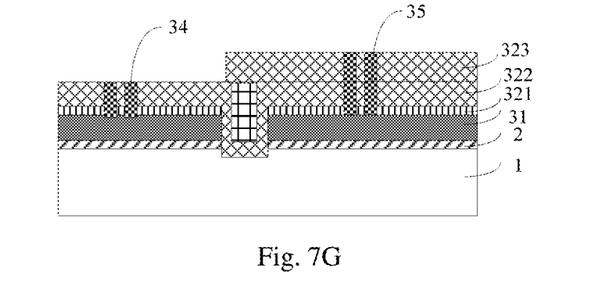

The remaining photoresist 10 is then removed (removed), as shown in FIG. 7G.

Figure 7H:
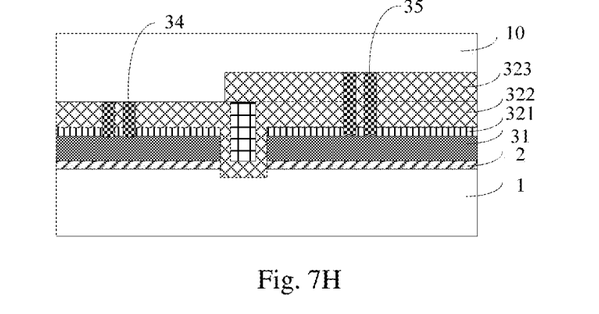

Step 7, a pattern including the contact layer 33 is formed.

Figure 7I:
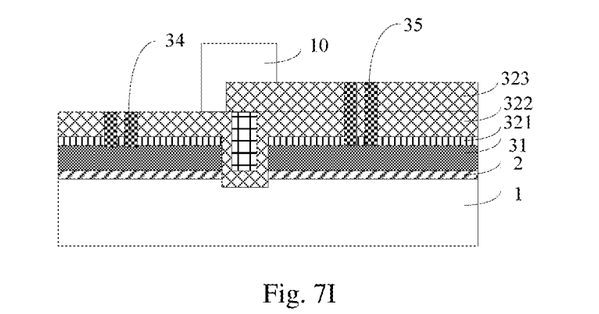

In this step, as shown in FIGS. 7H and 7I, a photoresist 10 is coated on the third insulating sub-layer 323 and the exposed second insulating sub-layer 322, exposed, developed, and etched, remaining a portion of the photoresist covering the gap region between the adjacent light-emitting devices (certainly also covering the dense support film 320).

Figure 7J:
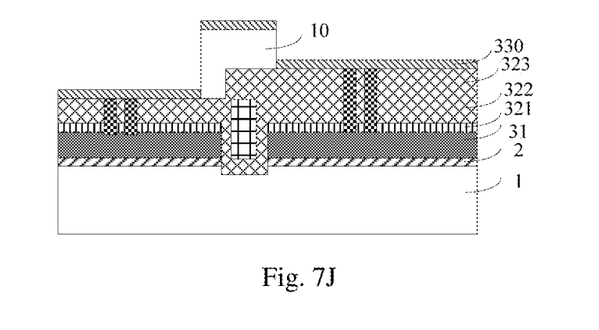
Figure 7K:
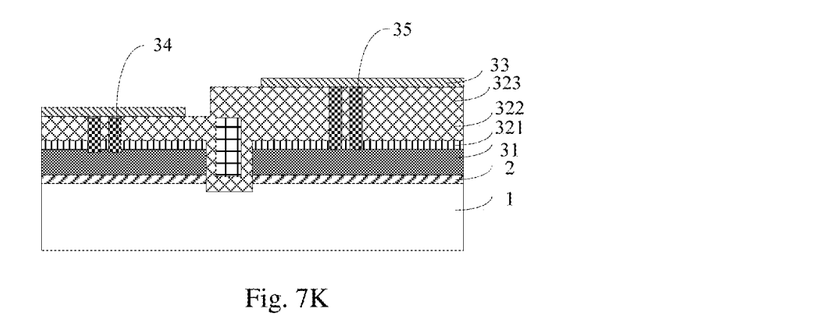

Next, as shown in FIG. 7J, a contact film layer 330 is formed on the entire upper surface of the photoresist 10, the first insulating sub-layer 322 and the second insulating sub-layer 323 by, for example, an electron beam evaporation coating process (E-beam evaporator for metal film); then, the photoresist 10 is removed by a lift off process and an ashing process, obtaining the structure of FIG. 7K. In this example, Indium Tin Oxide (ITO) is used to form the contact layer, but the present disclosure is not limited thereto, and the contact layer 33 may be formed of any other transparent conductive material.

The support film 320 is disposed in a gap region between two adjacent light-emitting devices. As described above, a step structure is formed in the gap region, and the step structure mainly functions to constitute a step height between the contact layers 33 (which may be referred to as ITO pads) of the two adjacent light-emitting devices. The support film 320 plated by the high density plasma process is dense, and in a case where an over etching (over etching) occurs when the contact layer 33 of the anode 3 is patterned, the support film 320 can effectively solve the over etching problem by enclosing and isolating functions. In addition, as can be seen from FIG. 7A, the via hole penetrates deep into the substrate 1, and thus the stability and isolation effect of the dense support film 320 can be increased.

From this point, the manufacturing of the anode 3 is completed.

Any one of silicon nitride SiNx, silicon oxide SiOx, or silicon oxynitride SiNO may be used as the material of the first insulating sub-layer, the second insulating sub-layer, and the third insulating sub-layer.

Further, the manufacturing method further includes other steps of forming the pixel define layer 4, the OLED device, the color filter layer 7 and the like.

Figure 7L:
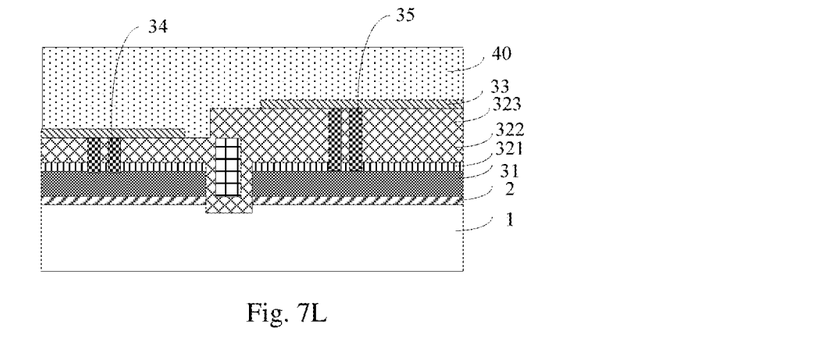

Step 8, a pattern including a pixel define layer 4 (PDL) is formed.

Figure 7M:
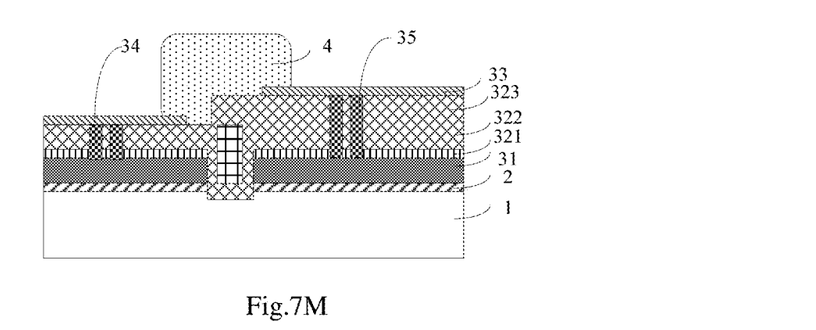

In this step, as shown in FIGS. 7L and 7M, a pixel define film layer 40 is coated on the contact layer 33, the exposed first insulating sub-layer and the second insulating sub-layer, a photoresist is coated, and the photoresist is exposed and developed to form a pattern of the pixel define layer 4.

In the step of forming the pixel unit, the anodes including the insulating layers of different thicknesses are formed for the light-emitting devices emitting light of different colors, so that the cavity length matched with the light-emitting devices emitting light of different colors can be formed for the light-emitting devices emitting light of different colors, and the efficiency of emitting light with a specific color can be enhanced.

Since the light-emitting devices emitting light of different colors include the same organic light-emitting layer and cathode, the organic light-emitting layer 5 in the OLED device is formed to be an entire layer through a deposition process without using a FMM in the subsequent manufacturing step.

Then, after the OLED device is formed, the color filter layer 7 is formed by using a conventional patterning process, which is not described herein. The color filter layer 7 allows only red light to pass through the red color filter layer, only green light to pass through the green color filter layer, and only blue light to pass through the blue color filter layer, thereby obtaining a higher color gamut and a higher brightness.

Although the above manufacturing method illustrated in FIGS. 7A to 7M includes forming only two adjacent light-emitting devices, the present disclosure is not limited thereto, and the above manufacturing method may alternatively form light-emitting devices emitting light of three different colors, and at this time, only the steps of forming a new insulating film layer, forming a via hole, and disposing a conductive material to form a connecting pillar are required to be added for a third light-emitting device, and these steps are not described in detail.

The present disclosure provides a pixel unit including a micro light-emitting device (Micro OLED) satisfying the strong microcavity effect and a manufacturing method thereof, wherein the anode of the light-emitting device is of a laminated structure, and the cavity length between the cathode and the reflecting layer of the anode is changed by adjusting the thickness of the insulating layer between the reflecting layer and the contact layer in the anode, so that the red light R light-emitting device, the green light G light-emitting device and the blue light B light-emitting device in the white OLED pixel unit have respective cavity optical paths, the light modulation effect of a single light-emitting device under the strong microcavity effect is realized, and the structure combining the white OLED pixel unit and color filters can obtain a high color gamut and high brightness without using an FMM; and the anode process disclosed by the present disclosure is favorable for reducing the cost.

Embodiments of the present disclosure further provide a display device including the pixel unit of the above embodiments.

The display device may be: a desktop computer, a tablet computer, a notebook computer, a mobile phone, a PDA, a GPS, a vehicle-mounted display, a projection display, a video camera, a digital camera, an electronic watch, a calculator, an electronic instrument, an instrument, a liquid crystal panel, electronic paper, a television, a display, a digital photo frame, a navigator and any other product or component with a display function, and can be applied to multiple fields such as public display and illusion display.

It will be understood that the above embodiments are merely exemplary embodiments employed to illustrate the principles of the present disclosure, and the present disclosure is not limited thereto. It will be apparent to a person skilled in the art that various changes and modifications can be made thereto without departing from the spirit and scope of the present disclosure, and these changes and modifications are to be considered within the scope of the present disclosure.

What is claimed is:

1. A pixel unit, comprising a plurality of light-emitting devices, which at least comprises first light-emitting device emitting light of a first color and a second light-emitting device emitting light of a second color, the first color being different from the second color, wherein,
the first light-emitting device and the second light-emitting device each comprise a first electrode, an organic light-emitting layer and a second electrode sequentially disposed on a substrate, wherein the first electrode comprises a reflecting layer, a transparent insulating layer and a transparent contact layer sequentially arranged on the substrate; and the second electrode is a semi-transparent electrode;
a first cavity is formed between the second electrode of the first light-emitting device and the reflecting layer of the first light-emitting device, and a second cavity is formed between the second electrode of the second light-emitting device and the reflecting layer of the second light-emitting device; and
the first cavity of the first light-emitting device has a first cavity length corresponding to a wavelength of light of the first color, the second cavity of the second light-emitting device has a second cavity length corresponding to a wavelength of light of the second color, and the first cavity length is different from the second cavity length, wherein every two adjacent light-emitting devices emitting light of different colors of the plurality of light-emitting devices are provided with a gap region therebetween, the two transparent insulating layers of the two adjacent light-emitting devices extended to the gap region and connected at the gap region to form a step structure; a support film is provided in a thicker transparent insulating layer of the two transparent insulating layers at the gap region, and the support film has a density greater than a density of a region of the thicker transparent insulating layer other than the support film.

2. The pixel unit according to claim 1, further comprising a third light-emitting device emitting light of a third color different from both the first color and the second color, wherein the third light-emitting device comprises a first electrode, an organic light-emitting layer and a second electrode sequentially disposed on a substrate, the first electrode comprises a reflecting layer, a transparent insulating layer and a transparent contact layer sequentially disposed on the substrate; and the second electrode is a semi-transparent electrode;

a third cavity is formed between the second electrode of the third light-emitting device and the reflecting layer of the third light-emitting device, and the third cavity of the third light-emitting device has a third cavity length corresponding to a wavelength of light of the third color, and the third cavity length is different from at least one of the first cavity length and the second cavity length.

3. The pixel unit according to claim 2, wherein a via hole is formed in the transparent insulating layer of each of the first to third light-emitting devices, wherein the via hole is filled with a conductive material to form a connecting pillar, and the reflecting layer of the light-emitting device and the transparent contact layer of the light-emitting device are electrically coupled to each other through the connecting pillar.

4. The pixel unit according to claim 3, wherein the first to third light-emitting devices have the reflecting layers of a same thickness, have the transparent contact layers of a same thickness, and have the transparent insulating layers of thicknesses corresponding to the wavelength of respective emitted light.

5. The pixel unit according to claim 1, wherein the light-emitting devices emitting light of different colors have the same organic light-emitting layer and/or the same first electrode.

6. The pixel unit according to claim 5, wherein the organic light-emitting layer comprises at least one hole layer of a hole injection layer and a hole transport layer, at least one electron layer of an electron injection layer and an electron transport layer, and at least one of a red light-emitting body layer, a green light-emitting body layer, and a blue light-emitting body layer disposed between the at least one hole layer and the at least one electron layer.

7. The pixel unit according to claim 6, wherein the first electrode is an anode and the second electrode is a cathode, and the organic light-emitting layer comprises a hole injection layer, a hole transport layer, a red light-emitting body layer, a green light-emitting body layer, an electron transport layer, a charge generation layer, a hole injection layer, a hole transport layer, a blue light-emitting body layer, an electron transport layer, and an electron injection layer sequentially disposed on the first electrode.

8. The pixel unit according to claim 7, further comprising a pixel define layer disposed on the step structure.

9. The pixel unit according to claim 8, wherein in each of the light-emitting devices, a color filter layer is further disposed on a side distal to the first electrode, the color filter layers disposed on the light-emitting devices emitting light of different colors are different in color, and the color filter layers enable the light-emitting devices to emit light of a single color, respectively.

10. The pixel unit according to claim 8, wherein the first light-emitting device, the second light-emitting device and the third light-emitting devices emit red, green and blue light, respectively, and the thicknesses of the transparent insulating layers of the first light-emitting device, the second light-emitting device and the third light-emitting devices increase sequentially.

11. A method for manufacturing a pixel unit comprising at least a first light-emitting device emitting light of a first color and a second light-emitting device emitting light of a second color, the first color being different from the second color, the method comprising:

forming a first reflecting layer of the first light-emitting device and a second reflecting layer of the second light-emitting device on a substrate;

forming a transparent first insulating layer of the first light-emitting device and a transparent second insulating layer of the second light-emitting device on the first reflecting layer and the second reflecting layer, respectively;

forming a transparent first contact layer of the first light-emitting device and a transparent second contact layer of the second light-emitting device on the transparent first insulating layer and the transparent second insulating layer, respectively;

forming a first organic light-emitting layer of the first light-emitting device and a second organic light-emitting layer of the second light-emitting device on the transparent first contact layer and the transparent second contact layer, respectively; and forming a second electrode of the first light-emitting device and a second electrode of the second light-emitting device on the first organic light-emitting layer and the second organic light-emitting layer, respectively, such that a first cavity is formed between the second electrode and the first reflecting layer of the first light-emitting device, a second cavity is formed between the second electrode and the second reflecting layer of the second light-emitting device, and a first cavity length of the first cavity corresponding to a wavelength of light of the first color is different from a second cavity length of the second cavity corresponding to a wavelength of light of the second color, wherein, forming the first reflecting layer of the first light-emitting device and the second reflecting layer of the second light-emitting device on the substrate by a single patterning process, such that the first reflecting layer and the second reflecting layer are spaced apart from each other to form a gap region between the first light-emitting device and the second light-emitting device; and wherein the forming the transparent second insulating layer of the first light-emitting device and the transparent second insulating layer of the second light-emitting device on the first reflecting layer and the second reflecting layer respectively comprises:

forming a first insulating film on the first reflecting layer, the second reflecting layer and the gap region such that the first insulating film is provided with a groove at the gap region;

forming a support film in the groove by a plasma enhanced chemical vapor deposition process; and forming a second insulating film on the first insulating film of the second light-emitting device and the support film by a patterning process, wherein an orthogonal projection of the second insulating film on the substrate does not overlap an orthogonal projection of the first reflecting layer on the substrate.

12. The method according to claim 11, wherein forming the transparent first contact layer of the first light-emitting device and the transparent second contact layer of the second light-emitting device on the transparent first insulating layer and the transparent second insulating layer respectively by a single patterning process, such that the transparent first contact layer and the transparent second contact layer are spaced apart each other and disposed on the first reflecting layer and the second reflecting layer respectively;

forming the first organic light-emitting layer of the first light-emitting device and the second organic light-emitting layer of the second light-emitting device on the transparent first contact layer and the transparent second contact layer respectively by a single patterning process; and forming the second electrode of the first light-emitting device and the second electrode of the second light-emitting device on the first organic light-emitting layer and the second organic light-emitting layer respectively by a single patterning process.

13. The method according to claim 11, further comprising:

forming a first via hole in the first insulating film of the first light-emitting device and filling a conductive material in the first via hole to form a first connecting pillar; and forming a second via hole in the first insulating film and the second insulating film of the second light-emitting device and filling a conductive material in the second via hole to form a second connecting pillar.

14. The method according to claim 13, wherein the forming the transparent first contact layer of the first light-emitting device and the transparent second contact layer of the second light-emitting device on the transparent first insulating layer and the transparent second insulating layer respectively by a single patterning process, such that the transparent first contact layer and the transparent second contact layer are spaced apart each other and disposed on the first reflecting layer and the second reflecting layer respectively comprises:

coating a photoresist on a part of the transparent first insulating layer at the gap region and a part of the transparent second insulating layer at the gap region;

forming a contact film layer on a residual part of the transparent first insulating layer, a residual part of the transparent second insulating layer and the photoresist; and forming a transparent first contact layer and a transparent second contact layer by removing the photoresist.

* * * * *